United States Patent
Guenter et al.

(10) Patent No.: US 11,579,224 B2
(45) Date of Patent: Feb. 14, 2023

(54) MAGNET SYSTEM FOR PERFORMING 2-FIELD NMR EXPERIMENTS AND ASSOCIATED RETROFITTING METHOD

(71) Applicant: Bruker Switzerland AG, Faellanden (CH)

(72) Inventors: Kenneth J. Guenter, Zurich (CH); Thomas Wuethrich, Greifensee (CH); Alexander Baer, Zurich (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 17/527,735

(22) Filed: Nov. 16, 2021

(65) Prior Publication Data

US 2022/0163610 A1 May 26, 2022

(30) Foreign Application Priority Data

Nov. 26, 2020 (DE) .......................... 102020214887.2

(51) Int. Cl.
*G01R 33/3815* (2006.01)
*G01R 33/38* (2006.01)
(Continued)

(52) U.S. Cl.
CPC ..... *G01R 33/3815* (2013.01); *G01R 33/3804* (2013.01); *G01R 33/3873* (2013.01); *H01F 6/04* (2013.01)

(58) Field of Classification Search
CPC ............ G01R 33/3815; G01R 33/3804; G01R 33/3873; G01R 33/3875; G01R 33/445; G01R 33/62; G01R 33/307; H01F 6/04
See application file for complete search history.

(56) References Cited

U.S. PATENT DOCUMENTS 9,279,868 B2   3/2016  Lohman et al.
2008/0290869 A1* 11/2008 Hutton .................. G01R 33/30
                                                              324/318
2010/0171495 A1   7/2010  Bovier et al.

FOREIGN PATENT DOCUMENTS

EP         1747478 B1      1/2007
EP       2 146 215 B1     10/2013
(Continued)

OTHER PUBLICATIONS

Cousin et al., "High-resolution two-field nuclear magnetic resonance spectroscopy", Phys. Chem. Chem. Phys., 2016, 18, 33187, 8 pages.

*Primary Examiner* — G. M. A Hyder
(74) *Attorney, Agent, or Firm* — Edell, Shapiro & Finnan, LLC

(57) ABSTRACT

In a magnet system: —a superconducting main field magnet (7) generates a magnetic field in a first sample volume (16), —a superconducting additional field magnet (22) generates another field in a second sample volume (24), —a cryostat (2) has a cooled main coil container (6), an evacuated RT (room temperature) covering (4), and an RT bore (14) which extends through the main and the additional field magnets, and —a cooled additional coil container (21) in a vacuum. The RT covering has a flange connection (17) with an opening (19) through which the RT bore extends, a front end of the additional coil container protrudes through the opening into the RT covering such that the additional field magnet also protrudes through the opening into the RT covering, and a closure structure (20) seals the RT covering between the flange connection and the RT bore.

25 Claims, 12 Drawing Sheets

(51) Int. Cl.
*G01R 33/3873* (2006.01)
*H01F 6/04* (2006.01)

(56) References Cited

FOREIGN PATENT DOCUMENTS

| | | |
|---|---|---|
| EP | 3 081 954 B1 | 10/2016 |
| WO | 0237132 A1 | 5/2002 |

* cited by examiner

MAGNET SYSTEM FOR PERFORMING 2-FIELD NMR EXPERIMENTS AND ASSOCIATED RETROFITTING METHOD

CROSS REFERENCE TO RELATED APPLICATIONS

This application claims foreign priority under 35 U.S.C. § 119(a)-(d) to German Patent Application 10 2020 214 887.2 filed on Nov. 26, 2020, and the contents of which are incorporated into the present application by reference in their entirety.

FIELD OF THE INVENTION

The invention relates to a magnet system for performing 2-field NMR experiments, comprising a superconducting main field magnet suitable for generating a first magnetic field in a first sample volume, a superconducting additional field magnet suitable for generating a second magnetic field in a second sample volume, the first magnetic field being stronger than the second magnetic field, and a cryostat having a cooled main coil container which contains the main field magnet, having an evacuated room temperature (=RT) covering which contains the main coil container, and having a room temperature (=RT) bore which extends through the main field magnet and through the additional field magnet and contains the first sample volume and the second sample volume.

Such a magnet system is known from EP 1 747 478 B1.

BACKGROUND

Nuclear magnetic resonance (=NMR) spectroscopy is a powerful method of instrumental analysis with which the chemical composition of samples can be examined. In this process, high-frequency signals are radiated into the sample, and the sample then emits high-frequency signals characteristic of its composition which are measured.

One option for increasing the measurement sensitivity and resolution of NMR measurements is so-called 2-field NMR spectroscopy. 2-field NMR spectroscopy is explained, for example, in S. F. Cousin et al., Phys. Chem. Chem. Phys., 2016, 18, 33187. A 2-field NMR spectrometer has two magnetic centers (locations) with different static magnetic field strengths at which high-frequency pulses can be applied to a sample and/or the reaction of the sample can be measured.

In a typical 2-field NMR experiment, the sample is first exposed to a first, strong magnetic field at a first location (first magnetic center, first sample volume) and then moved to a second location (second magnetic center, second sample volume) of a second, weaker magnetic field in which nuclear spins are relaxed and/or manipulated, and finally the sample is brought back to the location of the first, strong magnetic field where the actual NMR measurement takes place. At the second location, the polarization can be transferred to a desired atomic nucleus, as a result of which the NMR signal of this atomic nucleus can be amplified in the subsequent NMR measurement. In order to preserve the transferred polarization as much as possible when the sample is transported between the second location and the first location, this transport should take place quickly, for which a short path between the second location and the first location is desired.

The usual structure of a magnet system of a 2-field NMR spectrometer, as it was used, for example, by S. F. Cousin, loc. cit., has a superconducting magnet (magnetic coil) in a cryostat. The first sample volume (first magnetic center) is formed in the magnetic center of the superconducting magnet which is located in the room temperature bore of the cryostat. The second sample volume (second magnetic center) is in the room temperature bore in the stray field of the superconducting magnet, an approximately homogeneous magnetic field being generated locally through ferromagnetic shims. Similar magnet systems are known from EP 2 146 215 B1 and EP 3 081 954 B1.

This magnet structure can be produced using a standard NMR system by installing the ferromagnetic shims in the room temperature bore. The disadvantage of this magnet structure is that the field strength in the second sample volume is limited to approximately 0.5 Tesla or less. Furthermore, the field strength in the second sample volume is not freely adjustable. When the ferromagnetic shims are arranged in the room temperature bore, the installation space is also considerably restricted.

Arranging a main field magnet in a cryostat, the magnetic center of which main magnet forms the first sample volume (first magnetic center), and also arranging an additional field magnet in the cryostat, the magnetic center of which additional magnet forms the second sample volume (second magnetic center), is known from EP 1 747 478 B1. The main field magnet and the additional field magnet are located one above the other in a common helium container. This magnet structure allows the field strength in the second sample volume to be freely adjusted, but it is relatively expensive; the magnet system here is specifically designed for 2-field NMR. A standard NMR system cannot be converted to this magnet structure. If the magnetic field of the additional field magnet is intended to be swept, this leads to increased helium losses in the common helium tank due to the introduction of heat via the power supply lines, which is a quenching risk for the main field magnet.

Designing a DNP device separately from an NMR spectrometer and connecting the DNP device to an NMR spectrometer via a transfer line is known from WO 02/37132 A1 (DNP=dynamic nuclear polarization). The DNP device is designed to generate magnetic fields with a superconducting coil in its own cryostat and is arranged next to a cryostat of the NMR spectrometer. A standard NMR system can be used with this arrangement, but the path between the sample volume of the DNP device and the sample volume of the NMR spectrometer is quite long, which can cause significant losses in sample polarization.

U.S. Pat. No. 9,279,868 discloses an apparatus and method for rapid DNP. A sample is movable between two positions. One position is in a high field polarization magnet having a cryostat. The other position is in an auxiliary low field magnet arranged above said cryostat.

SUMMARY

One object of the invention is that of providing a magnet structure which renders 2-field NMR spectroscopy which can be used flexibly and has good signal strength possible in a cost-effective manner.

Overview Description

This object is achieved according to one formulation of the invention, by a magnet system of the type mentioned at the outset, characterized in that the magnet system comprises a cooled additional coil container which is surrounded by a vacuum, contains the additional field magnet and is spaced apart from the main coil container, in that the RT covering has a flange connection, the RT bore extending through a flange opening of the flange connection, in that a front end of the additional coil container protrudes through the flange opening into the RT covering such that the additional field magnet also at least partly protrudes through the flange opening into the RT covering, and in that there is a closure structure which is installed on the flange connection of the RT covering and seals the RT covering between the flange connection and the RT bore.

In many standard NMR magnet systems, the cryostat or its room temperature (=RT) covering is equipped, at an axial end of the room temperature (=RT) bore, with a flange connection (also referred to as a room temperature flange) via which the inside of the cryostat or the RT covering can be made accessible. In the context of the present invention, such a flange connection is used to dock an additional coil container which contains the additional field magnet.

The additional coil container with the additional field magnet contained therein protrudes through the flange opening into the RT covering, as a result of which the additional field magnet or the second sample volume can move particularly close to the first sample volume in its magnetic center. The additional field magnet therefore uses part of the interior of the cryostat.

The first sample volume is located at the location of the magnetic center of the main field magnet which is arranged in the main coil container in the cryostat. Starting from a standard NMR magnet system in which only a main field magnet and a first sample volume having a first magnetic field are set up, retrofitting with the additional field magnet in order to set up the second sample volume is easily possible, in particular using the flange connection also for fastening the additional coil container of the additional field magnet, usually indirectly via the closure structure. The cryostat does not have to be adjusted, or at most has to be adjusted only slightly, for example by exchanging a wall pipe of the RT bore if said bore is intended to be set up continuously.

The RT covering is sealed with the closure structure at the flange connection in order to be able to maintain the vacuum inside the RT covering for insulating the main coil container; in this respect, the closure structure replaces the flange cover which is present in a standard NMR magnet system. It should be noted that other structures can be integrated into the closure structure and, as a result, these other structures (such as an additional vacuum container) can be part of the seal between the flange connection and the RT bore. It should also be noted that the closure structure does not have to provide sealing directly from the surroundings, but can also provide sealing, for example, from a vacuum in an additional vacuum container.

Since the second magnetic field is set up in the second sample volume using an additional field magnet which is separate from the main field magnet, the second magnetic field can in principle be selected as desired and independently of the first magnetic field, in particular also with a field strength greater than 0.5 Tesla. The second magnetic field B2 is usually significantly smaller than the first magnetic field B1, preferably where $B2 \leq 0.33*B1$, particularly preferably where $B2 \leq 0.25*B1$, and very particularly preferably $B2 \leq 0.20*B1$. It should be noted that the first magnetic field is usually 10 Tesla or more, usually $10 \text{ T} \leq B1 \leq 20$ Tesla. The second magnetic field B2 is usually 3 Tesla or less, usually $0.5 \text{ T} \leq B2 \leq 3 \text{ T}$.

In addition, the additional coil container does not in principle restrict the installation space inside the RT bore; typically, the RT bore extends with a constant diameter in the region including and between the main coil container and the additional coil container. The additional coil container encompasses the room temperature bore.

In a vertically oriented RT bore, the flange connection is typically formed at the top or bottom of the cryostat. The flange connection is usually circular.

The separate main coil container and additional coil container are thermally decoupled from one another, in particular due to the vacuum in the evacuated RT covering and the vacuum which surrounds the additional coil container. If the magnetic field of the additional field magnet is intended to be swept, this does not increase the quenching risk of the main field magnet. The main coil container and the additional coil container are typically arranged coaxially with respect to the axis of the room temperature bore, the main coil container and the additional coil container being arranged next to one another with respect to this axis (i.e., one above the other when the axis is arranged vertically) and at a distance from one another.

The vacuum in which the additional coil container is arranged is preferably connected to the vacuum of the evacuated RT covering. Alternatively, the vacuum in which the additional coil container is arranged can also be separated from the vacuum of the evacuated RT covering; in this case, an additional vacuum container in which the additional coil container is arranged can be used.

The main field magnet and the additional field magnet are preferably electrically separated from one another. The field strength of the additional field magnet is generally adjustable via the electric current in an associated superconducting magnet coil which is fed by a power supply unit, usually in a range of from 0.5 T to 3.0 T. The power supply unit can maintain the current flow during operation (driven mode operation), or the additional field magnet has a superconducting switch such that a persistent electric current flows during operation (persistent mode operation).

Cooling of the main coil container and cooling of the additional coil container are preferably independent of one another. The main coil container generally contains liquid and/or super-liquid helium for cooling the main field magnet; optionally, a cryocooler (such as a pulse tube cooler) can be provided for He-reliquefaction; alternatively, cryogen-free cooling of the main coil container or the main field magnet contained therein can also be provided using a cryocooler. The additional coil container can contain liquid and/or super-liquid helium for cooling; active, in particular cryogen-free, cooling of the additional coil container or the additional field magnet contained therein is preferably provided by a cryocooler.

The additional coil container can be surrounded by its own cooled radiation shield; this radiation shield can be cooled, for example, using liquid nitrogen or by the first cooling stage of a cryocooler which also cools the additional coil container with one or more further cooling stages.

A sample is prepared for an NMR measurement at the location of the second sample volume, and the sample is then subjected to the actual NMR measurement at the location of the first sample volume. In particular, it is possible to first pre-polarize a sample in the first sample volume, then to bring the sample to the second sample volume and relax it there and/or subject it to spin manipulation, and finally to bring the sample back to the first sample volume and subject it to NMR measurement there. For this purpose, for a measurement in the RT bore, an NMR coil system (for example, comprising transmitter and read coils) is arranged around the first sample volume and around the second sample volume. A magnet system according to the invention is preferably used for such a 2-field NMR experiment.

The magnet system typically has a transport mechanism with which a sample can be moved in the RT bore between the first sample volume (in the magnetic center of the main field magnet) and the second sample volume (in the magnetic center of the additional field magnet). The transport mechanism is at least partly arranged in the RT bore.

The magnet system according to the invention is generally constructed in such a way that the variation of the stray field of the additional field magnet over an axial length of 1 cm in the center of the first sample volume, normalized to the total magnetic field strength in the first sample volume, is 10 ppm or less, usually even 1 ppm or less. Conversely, the variation of the stray field of the main field magnet over an axial length of 1 cm in the center of the second sample volume, normalized to the total magnetic field strength in the second sample volume, is generally in the range of 10-50 ppm. In order to minimize the stray fields, the main field magnet and the additional field magnet are generally actively shielded. The homogeneity in the two sample volumes can, if necessary, be improved using shim devices. The magnetic force between the two magnets (during operation at maximum operating current) is typically 500 N or less, and usually 100 N or less or even 10 N or less.

The magnetic fields are generally considered here with regard to their axial direction (along the RT bore, B0 direction), in particular with regard to their strength and homogeneity.

PREFERRED EMBODIMENTS

In a preferred embodiment of the magnet system according to the invention, the magnet system forms a closed, evacuated additional vacuum container in which the additional coil container is arranged, and in which the vacuum in which the additional coil container is arranged prevails such that the vacuum in the additional vacuum container is separated from a vacuum in the RT covering. As a result, the thermal insulation between the additional coil container and the main coil container can be improved, or the installation of the additional coil container can also be simplified.

Furthermore, an embodiment is preferred in which the closure structure comprises an insert portion which protrudes into the flange opening and projects inwardly with respect to the RT covering, a front end of the additional coil container protrudes into the insert portion, and the RT bore extends through the insert portion. Space inside the cryostat or its RT covering, which can then be used for the additional coil container, can be divided in accordance with the insert portion, the vacuum in the RT covering being sealed with the insert portion. The additional coil container can be made accessible without breaking the vacuum in the RT covering, for example for a repair. The insert portion is typically cup-shaped and has a through-opening for the RT bore. This embodiment having an insert portion can in particular be combined with an additional vacuum container.

In an advantageous embodiment, the magnet system comprises a hood portion which engages over the flange opening and projects outwardly with respect to the RT covering, a rear end of the additional coil container protrudes into the hood portion, and the RT bore extends through the hood portion.

A space in which the additional container is accommodated can be defined by the hood portion. The hood portion can be used to set up the vacuum in which the additional coil container is arranged. The closure structure can comprise the hood portion. The hood portion is typically cup-shaped and has a through-opening for the RT bore. The embodiment having a hood portion can in particular be combined with designs having an additional vacuum container and/or insert portion.

A development of an embodiment having an additional vacuum container, insert portion and hood portion is preferred in which the additional vacuum container is delimited by the walls of the hood portion, of the insert portion and of the RT bore, the insert portion sealing the vacuum in the RT covering from the vacuum in the additional vacuum container. This design allows substantial space in the radial direction for the additional coil container and allows good thermal decoupling of the main coil container and the additional coil container. An exemplary, corresponding design is explained in FIG. 2.

A development of an embodiment having a hood portion is also preferred in which the closure structure comprises the hood portion,
a first gap between the walls of the additional coil container and of the hood portion is designed to be open toward the RT covering,
the vacuum in which the additional coil container is arranged and a vacuum in the RT covering are connected to one another,
and the hood portion seals the vacuum in the RT covering from the surroundings. This design is particularly simple; the additional coil container also has substantial space in the radial direction and can move very close to the main coil container in the axial direction. An exemplary, corresponding design is explained in FIG. 1.

A development of an embodiment having an additional vacuum container and hood portion is also advantageous in which
the closure structure comprises the hood portion,
a rear end of the additional vacuum container protrudes into the hood portion,
a second gap between the walls of the hood portion and of the additional vacuum container is designed to be open toward the RT covering,
and the hood portion seals the vacuum in the RT covering from the surroundings. This design allows particularly good thermal decoupling of the additional coil container from the main coil container. The additional vacuum container can simultaneously also serve as a radiation shield which completely surrounds the additional coil container. An exemplary, corresponding design is explained in FIG. 4.

In a preferred development of an embodiment having an additional vacuum container and insert portion, the additional vacuum container is arranged on a side of the insert portion facing away from the main coil container,
the additional vacuum container is delimited by a container wall, which is separate from the insert portion, and the RT bore,
and the insert portion seals the vacuum in the RT covering from the surroundings. This design is particularly simple. The additional vacuum container can be handled as its own assembly without touching the vacuum of the RT covering. As a result, the alignment of the additional field magnet can also be simplified. In addition, it is particularly easy to exchange or repair the additional vacuum container or also the components contained therein, in particular without the main field magnet having to be removed. An exemplary, corresponding design is explained in FIG. 3.

An advancement of this development is advantageous in which the wall of the RT bore is formed from multiple pieces, a first section of the wall of the RT bore delimiting the RT covering as far as the insert portion, and a second section of the wall of the RT bore delimiting the additional vacuum container. This further simplifies the installation and, if necessary, the removal as well as the alignment of the additional vacuum container and the components contained therein, in particular the additional coil container including the additional field magnet.

In a preferred embodiment, the wall of the RT bore is formed in one piece. In many designs, this simplifies sealing the RT bore from the vacuum in the RT covering and/or the vacuum in which the additional coil container is arranged.

An embodiment is preferred in which the cryostat is designed having a cooled intermediate container which is arranged in the evacuated RT covering, the main coil container being arranged in the intermediate container, in particular the intermediate container being cooled with liquid nitrogen. As a result, the thermal insulation of the main coil container from the surroundings or its cooling to cryogenic temperatures of 4.2 K or less can be simplified.

An embodiment is particularly advantageous in which the additional coil container has a maximum outer diameter DZSB transverse to the RT bore that is smaller than the minimum inner diameter MID of the flange opening, in particular all components which protrude through the flange opening into the RT covering having a maximum outer diameter DALL transverse to the RT bore that is smaller than the minimum inner diameter MID of the flange opening. This simplifies the installation of the additional coil container or all of the protruding components because the additional coil container or the protruding components can simply be inserted axially into the cryostat through the flange opening. If there is an additional vacuum container, DZVB<MID also preferably applies to its maximum outer diameter DZVB. Alternatively, it is also possible to swivel the additional coil container or protruding components when installed or to dismantle them and only assemble them in the protruding state.

An embodiment is also advantageous in which there is a shim system for homogenizing the magnetic field in the second sample volume. Using the shim system, the homogeneity in the second sample volume can be improved, in accordance with the requirements of a provided polarization process. An active (electrical) shim system is preferably provided. The shim system can be arranged inside the room temperature bore or also outside the room temperature bore, in particular also seated on the outside of the wall of the room temperature bore, or also arranged on or in the additional coil container.

Particularly preferred is an embodiment in which the RT bore passes through a magnetic tunnel in a region between the first sample volume and the second sample volume or contains a magnetic tunnel such that during operation the magnetic field is at least 0.1 T, preferably at least 0.5 T, everywhere along a sample transport path in the RT bore between the first sample volume and the second sample volume. With the magnetic tunnel, polarization losses in a sample can be reduced during the transport from the second sample volume to the first sample volume. The magnetic tunnel typically comprises a set of permanent magnets and/or a set of magnetic coils, typically arranged radially on the outside or inside of the wall of the RT bore.

An embodiment is particularly preferred in which the first sample volume and the second sample volume are at a distance AB, where 0.6 m≤AB≤1.3 m. Such small distances can be set up using the present invention with little effort, as a result of which polarization losses during the transport of a sample from the second to the first sample volume can be minimized. In general, preferably AB≤1.2 m, particularly preferably AB≤1.0 m. The distance AB is measured in the axial direction (along the RT bore).

An embodiment is particularly preferred in which the main field magnet and the additional field magnet are electrically separated from one another. This makes it particularly easy to adjust the field strengths of the first and second magnetic fields separately, and a sudden loss of superconductivity (quench) in one of the two magnets has no direct effect on the other magnet.

Retrofitting Method According to the Invention

The scope of the present invention also includes a method for retrofitting a magnet system for 2-field NMR experiments, in particular in order to obtain a magnet system according to the invention as described above, comprising the following steps:

a) providing a magnet system, comprising a superconducting main field magnet suitable for generating a first magnetic field in a first sample volume, and a cryostat having a coolable main coil container which contains the main field magnet, having an evacuable room temperature (=RT) covering which contains the main coil container, and having a room temperature (=RT) bore which extends through the main field magnet and contains the first sample volume, the RT covering having a flange connection, the flange opening of which is closed by a flange cover, the RT bore extending through the flange opening and the flange cover;

b) removing the flange cover from the flange connection;

c) installing an additional coil container which is coolable in the installed state, is surroundable by a vacuum, and contains a superconducting additional field magnet, and installing a closure structure which seals the RT covering between the flange connection and the RT bore on the flange connection of the RT covering, a front end of the additional coil container protruding through the flange opening into the RT covering such that the additional field magnet at least partly protrudes through the flange opening into the RT covering, the additional field magnet being suitable for generating a second magnetic field in a second sample volume, the first magnetic field being stronger than the second magnetic field, and the RT bore also extending through the additional field magnet and containing the second sample volume. Using the method according to the invention, it is possible to upgrade a standard NMR magnet system, which is only equipped with a main field magnet for a first sample volume and has an axial flange connection, for 2-field NMR measurements in a simple and cost-effective manner. Due to the fact that the additional coil container protrudes through the flange opening into the RT covering of the cryostat, the axial distance between the first sample volume in the magnetic center of the main field magnet and the second sample volume in the magnetic center of the additional field magnet can be kept small. The additional field magnet is spatially separated from the main field magnet such that there is no thermal coupling or, at most, only a little thermal coupling. The magnetic field in the second sample volume can be adjusted specifically for the application with the additional field magnet.

A variant of the method according to the invention is preferred in which during step c) the additional coil container is rigidly connected to the closure structure, in particular during step c) all components which protrude through the flange opening into the RT covering being rigidly connected to the closure structure. This facilitates the assembly of the magnet system. Essentially, only one assembly needs to be aligned and secured.

In a preferred variant, after step a) an existing, one-piece wall pipe of the RT bore of the cryostat is replaced by an axially longer, one-piece wall pipe. The longer wall pipe can then also pass through the additional coil container. As a result, a high degree of tightness of the RT bore can be achieved in a simple manner in many designs of the magnet system.

In an alternative, advantageous variant, after step a) an existing, one-piece wall pipe of the RT bore of the cryostat is shortened or replaced by a shorter wall pipe such that a first section of a wall of the RT bore is arranged in the cryostat, which first section protrudes through at least the main coil container, and a second section of a wall of the RT bore is also installed, which second section protrudes through at least the additional coil container, in particular the second section being installed together with the additional coil container during step c). The installation and alignment of the additional coil container and the additional field magnet, and generally the handling of an associated assembly, can be simplified by a two-piece wall of the RT bore.

Further advantages of the invention will become apparent from the description and the drawings. According to the invention, the above-mentioned features and those described below can each be used in isolation or together in any combination. The embodiments shown and described are not to be interpreted as an exhaustive list but rather have exemplary character for the description of the invention.

BRIEF DESCRIPTION OF THE DRAWINGS

FIG. 5B removal of the flange cover and the old wall pipe;
FIG. 5C open magnet system;
FIG. 5D installation of the additional coil container and hood portion;
FIG. 5E partly assembled magnet system;
FIG. 5F installation of a new, longer wall pipe.

FIG. 6B removal of the flange cover and the old wall pipe;
FIG. 6C open magnet system;
FIG. 6D installation of the insert portion and the shorter wall pipe;
FIG. 6E partly assembled magnet system;
FIG. 6F installation of the additional vacuum container having an additional coil container.

DETAILED DESCRIPTION

Figure 1:
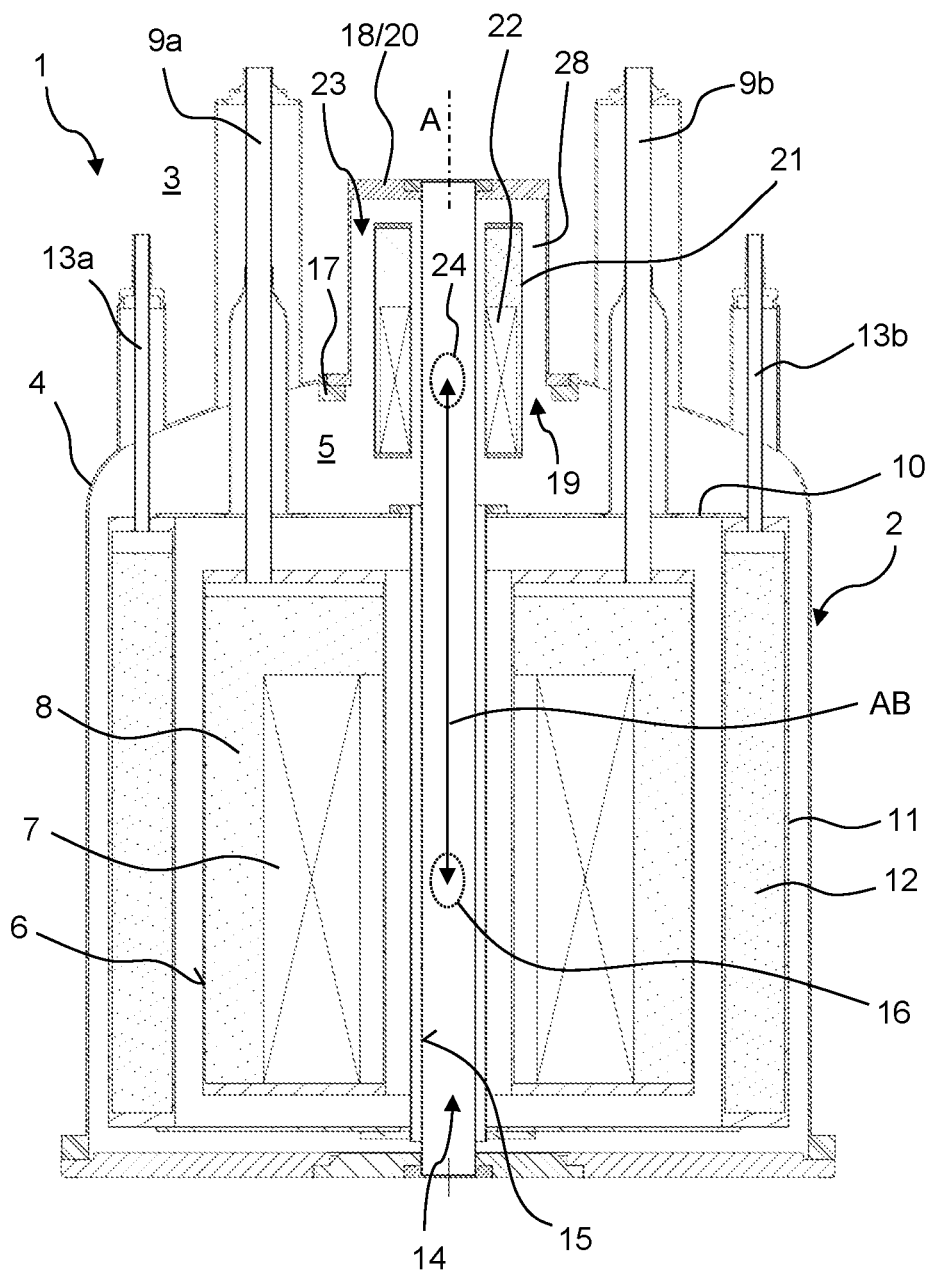
FIG. 1 shows a schematic longitudinal section through a first embodiment of a magnet system according to the invention, comprising a hood portion which is open toward the RT covering of the cryostat, and a uniform vacuum space.

FIG. 1 schematically shows a magnet system according to the invention, on which 2-field NMR experiments can be carried out, in a first embodiment in longitudinal section.

The magnet system 1 is designed having a cryostat 2 which is outwardly delimited from the surroundings 3 by a room temperature (=RT) covering 4. In addition, a room temperature bore 14 which is oriented along an axis A, which is vertical here, passes through the cryostat 2; the longitudinal section of FIG. 1 is selected along this axis A. In the design shown, the RT bore 14 is delimited by a continuous (one-piece) wall pipe 15.

A vacuum 5 prevails inside the RT covering 4. In this vacuum 5, the cryostat 2 contains a main coil container 6 in which a superconducting main field magnet 7 in the form of a superconducting coil system is arranged. Liquid helium 8 is also located in the main coil container 6 in order to cool the main field magnet 7.

In the embodiment shown, the main coil container 6 can be reached via the neck pipes 9a, 9b, for example in order to refill it with liquid helium. In addition, the main coil container 6 is arranged here in an intermediate container 10 cooled with nitrogen, on the radial outside of which a tank 11 for liquid nitrogen 12 is formed. The tank 11 can be reached via the neck pipes 13a, 13b, for example for refilling it with liquid nitrogen. The same vacuum 5 as in the rest of the interior of the RT covering 4 prevails inside the intermediate container 10 in the design shown; the intermediate container 10 is therefore not designed to be gas-tight, but primarily is used as a cooled radiation shield.

During operation, the main field magnet 7 generates a first magnetic field, which has a high field strength B1, usually of 10 Tesla or more, and has high homogeneity having a relative field strength variation usually of 10 ppm or less over an axial length of 1 cm, in a first sample volume 16 at its magnetic center (first magnetic center of the magnet system 1).

The RT covering 4 of the cryostat 2 is formed at an upper axial end having a flange connection 17 on which a hood portion 18 is installed here. The hood portion 18 seals the RT covering 4 between the flange connection 17 and the RT bore 14, here from the surroundings 3. The hood portion 18 is therefore a closure structure 20 here, which is installed on the flange connection 17. The hood portion 18 is essentially cup-shaped and projects outward (here axially upward) with respect to the RT covering 4.

The hood portion 18 engages over an additional coil container 21 in which a superconducting additional field magnet 22 is arranged. This additional coil container 21 is cooled in a manner which is not shown in more detail, for example by a pulse tube cooler. If desired, the additional coil container 21 can be surrounded by its own, cooled radiation shield (not shown in more detail).

The additional field magnet 22 comprises a superconducting coil system. Using the additional field magnet 22, a second magnetic field can be generated, during operation, in a second sample volume 24 at the magnetic center of the additional field magnet 22 (second magnetic center of the magnet system 1). The second magnetic field has a smaller field strength B2 than the first magnetic field. The field strength B2 of the second magnetic field is usually between 0.5 T and 3.0 Tesla. In most applications, the second magnetic field does not need to be quite as homogeneous as the first magnetic field; usually the homogeneity of the second magnetic field is 10-50 ppm over an axial length of 1 cm.

The additional coil container 21 is surrounded by a vacuum 23. An evacuated, first gap 28 between the hood portion 18 and the additional coil container 21 is designed to be open toward the RT covering (in FIG. 1 downward, toward the flange opening 19) such that the vacuum 5 in the RT covering 4 and the vacuum 23 which surrounds the additional coil container 21 in the region of the first gap 28 are connected to one another and thus form a common vacuum space.

A front (lower) end of the additional coil container 21 protrudes through the flange opening 19 of the flange connection 17 into the RT covering 4, and the additional field magnet 22 likewise protrudes through the flange opening 19 into the RT covering 4. As a result, installation space inside the RT covering 4 of the cryostat 2 is partly used for the arrangement of the additional coil container 21 and the additional field magnet 22. A rear (upper) end of the additional coil container 21 protrudes into the hood portion 18.

The RT bore 14 protrudes through the main coil container 6, the additional coil container 21, the flange opening 19 and the hood portion 18. The sample volumes 16, 24 are in the RT bore 14 at an (axial) distance AB which is preferably 1.3 m or less, for example approximately 1.0 m (measured center to center). A sample to be measured can be transferred between the first sample volume 16 and the second sample volume 24 and back using a transport mechanism (not shown in more detail) and preferably also into and out of the RT bore 14. For the spin manipulations and measurements, NMR probe heads (not shown in more detail) can protrude from the outside (typically from the two axial ends) into the RT bore 14 as far as the sample volumes 16, 24.

In the design of FIG. 1, the additional field magnet 22 can move particularly close to the main field magnet 7 such that polarization loss can be minimized when a sample is transported between the sample volumes 24, 16. Furthermore, substantial radial installation space is available for the additional coil container 21. In addition, only one vacuum space has to be maintained.

With regard to the embodiments of FIG. 2 to FIG. 4, which largely correspond to the design of FIG. 1, only the fundamental differences from the design of FIG. 1 are explained below.

Figure 2:
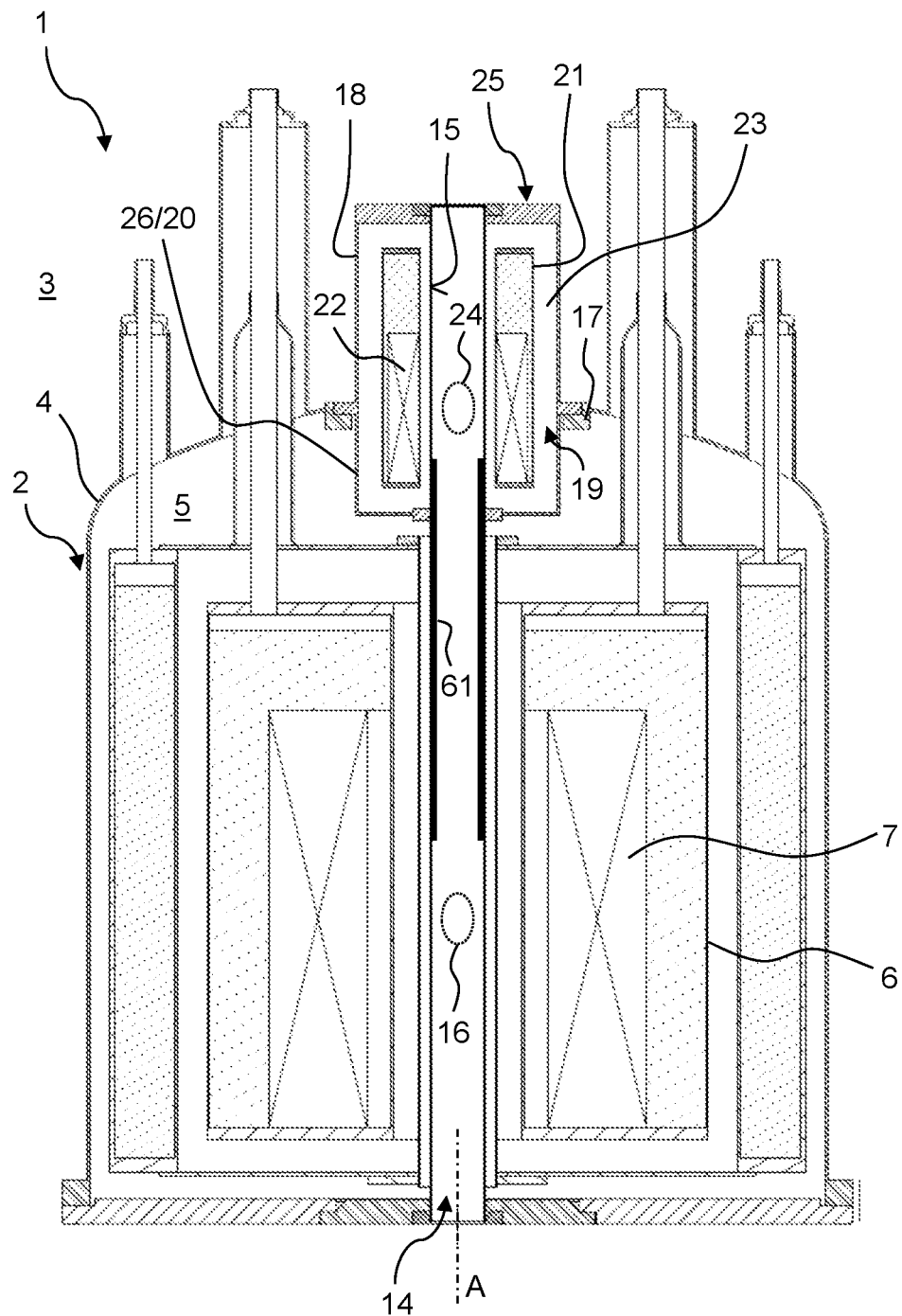
FIG. 2 shows a schematic longitudinal section through a second embodiment of a magnet system according to the invention, comprising a hood portion and an insert portion which together form an additional vacuum container.

In the second embodiment of a magnet system 1 according to the invention shown in FIG. 2, the additional coil container 21 is arranged in an additional vacuum container 25 in which the vacuum 23 which surrounds the additional coil container 21 is set up. The additional vacuum container 25 is delimited by an insert portion 26, a hood portion 18 and the RT bore 14 or its wall pipe 15.

The insert portion 26 protrudes through the flange opening 19 into the RT covering 4 of the cryostat 2, and seals the RT covering 4 (or the vacuum 5 in its interior) between the flange connection 17 and the RT bore 14. The insert portion 26 therefore forms a closure structure 20 for the RT covering here. The insert portion 26 is approximately cup-shaped here, having a through-opening for the RT bore 14.

Here, the hood portion 18, which protrudes outwardly with respect to the RT covering 4, here axially upward, is connected in one piece to the insert portion 26. The hood portion 18 engages over the flange opening 19 and the additional coil container 21, and seals the additional vacuum container 25 from the surroundings 3. The additional vacuum container 25 is installed laterally on the outside in the region of the transition from the insert portion 26 and the hood portion 18 to the flange connection 17.

A front (lower) end of the additional coil container 21 protrudes through the flange opening 19 into the insert portion 26 and into the axial region of the RT covering 4; likewise, a front (lower) end of the additional field magnet 22 protrudes through the flange opening 19 into the insert portion 26 and into the axial region of the RT covering 4.

In the design of FIG. 2, a magnetic tunnel 61, which is formed here on the inside of the wall of the RT bore 14, is set up for the transport path of a sample between the first sample volume 16 and the second sample volume 24. The magnetic tunnel 61 ensures that the sample always remains exposed to a magnetic field of a certain minimum strength, for example at least 0.1 Tesla, on said transport path. In this way, polarization losses during sample transport can be minimized. The magnetic tunnel 61 here comprises a permanent magnetic structure which is oriented along the axis A (axis of the RT bore 14, simultaneously the direction of the magnetic fields generated by the main field magnet 7 and the additional field magnet 22).

In the embodiment shown, the vacuum 5 of the RT covering 4 and the vacuum 23 in which the additional coil container 21 is arranged are separated from one another by the insert portion 26, as a result of which particularly good thermal insulation of the main coil container 6 and the additional coil container 21 is achieved. Substantial radial installation space is also available for the additional coil container 21 and the additional field magnet 22.

Figure 3:
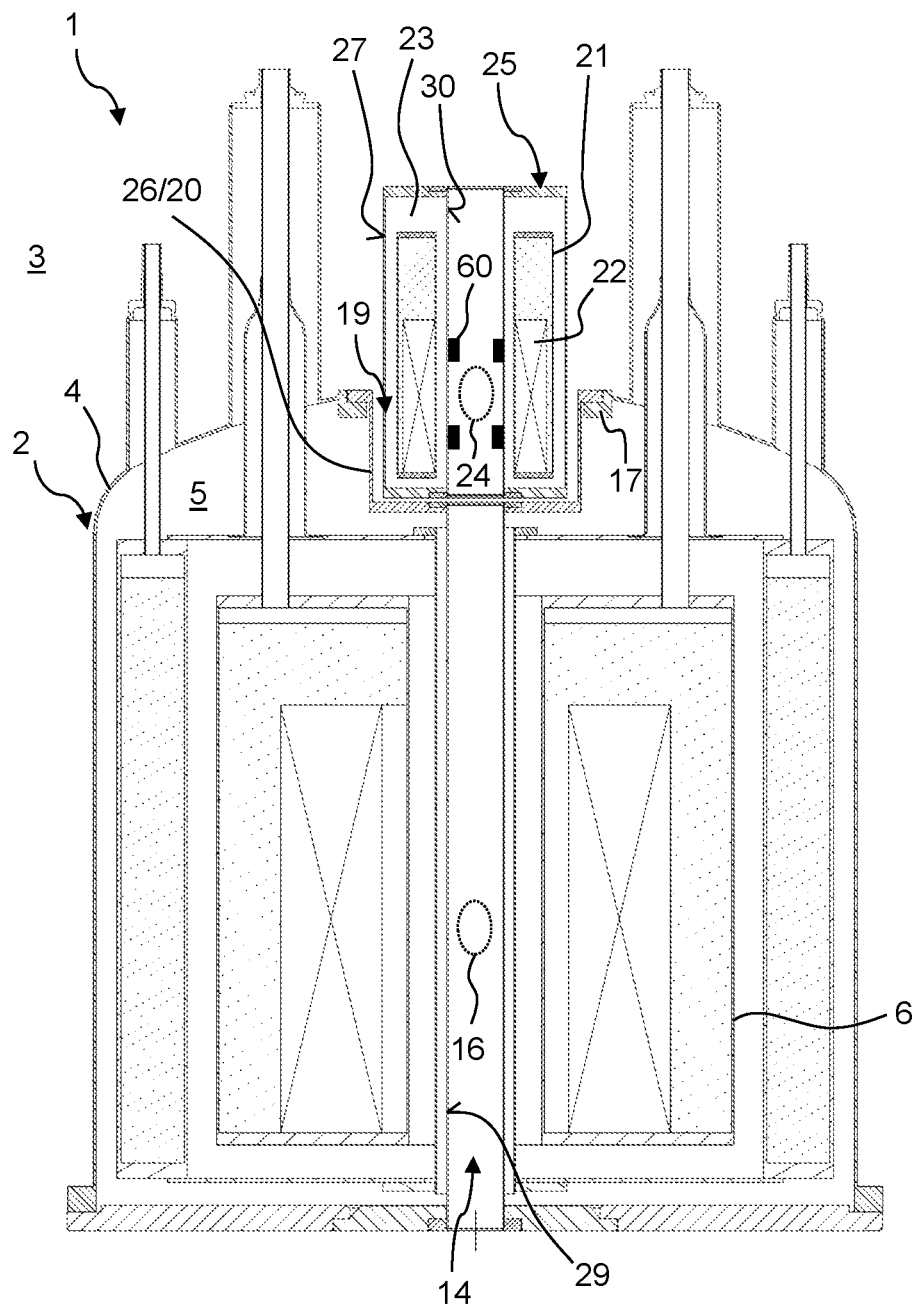
FIG. 3 shows a schematic longitudinal section through a third embodiment of a magnet system according to the invention, comprising an insert portion and an additional vacuum container outside the vacuum of the RT covering.

In the magnet system 1 according to the third embodiment of FIG. 3, an additional vacuum container 25 is also set up for the additional coil container 21. The additional vacuum container 25 is delimited by its own container wall 27 and the RT bore 14 and as a result is sealed from the surroundings 3.

The RT covering 4 is sealed from the surroundings 3 between the flange connection 17 and the RT bore 14 with an insert portion 26 which protrudes through the flange opening 19 into the RT covering 4. The insert portion 26 is therefore a closure structure 20 of the RT covering 4. The insert portion 26 is installed on the flange connection 17.

The additional vacuum container 25 is arranged entirely on a side of the insert portion 26 facing away from the main coil container 6. A front (lower) end of the additional vacuum container 25 protrudes through the flange opening 19 from the behind (above) into the insert portion 26, and therefore also into the axial region of the RT covering 4 of the cryostat 2. A front (lower) end of the additional coil container 21 which is arranged inside the additional vacuum container 25 also protrudes through the flange opening 19 into the insert portion 26 and therefore into the axial region of the RT covering 4. A front (lower) end of the additional field magnet 22 likewise protrudes through the flange opening 19 into the insert portion 26 and into the axial region of the RT covering 4. The insert portion 26, which is approximately cup-shaped here, opens up installation space for the additional vacuum container 25 or the additional coil container 21 and the additional field magnet 22 inside the RT covering 4 such that the second sample volume 24 can be arranged close to the first sample volume 16. Furthermore, a rear end of the additional vacuum container 25 projects outward (here axially upward) with respect to the RT covering 4 of the cryostat 2.

The RT bore 14 is not formed having a continuous wall pipe here, but in two pieces. A lower, first section 29 of the wall of the RT bore 14 delimits the RT bore 14 in the region of the RT covering 4 as far as the insert portion 26. An upper section 30 of the wall of the RT bore 14 delimits the RT bore 14 in the region of the additional vacuum container 25.

The magnet system 1 here also includes a shim system 60 for homogenizing the second magnetic field in the second sample volume 24. The shim system 60 here consists of a set of normally conductive, electrical magnetic coils which are arranged on the inside of the wall of the RT bore 14 axially on both sides of the second sample volume 24.

In the design shown, the additional coil container 21, together with the additional vacuum container 25, can be installed or exchanged particularly easily, or can also be aligned with respect to the cryostat 2. In addition, separating the vacuum 5 in the RT covering 4 and the vacuum 23 in the additional vacuum container 25 provides very good thermal insulation for the main coil container 6 and the additional coil container 21.

Figure 4:
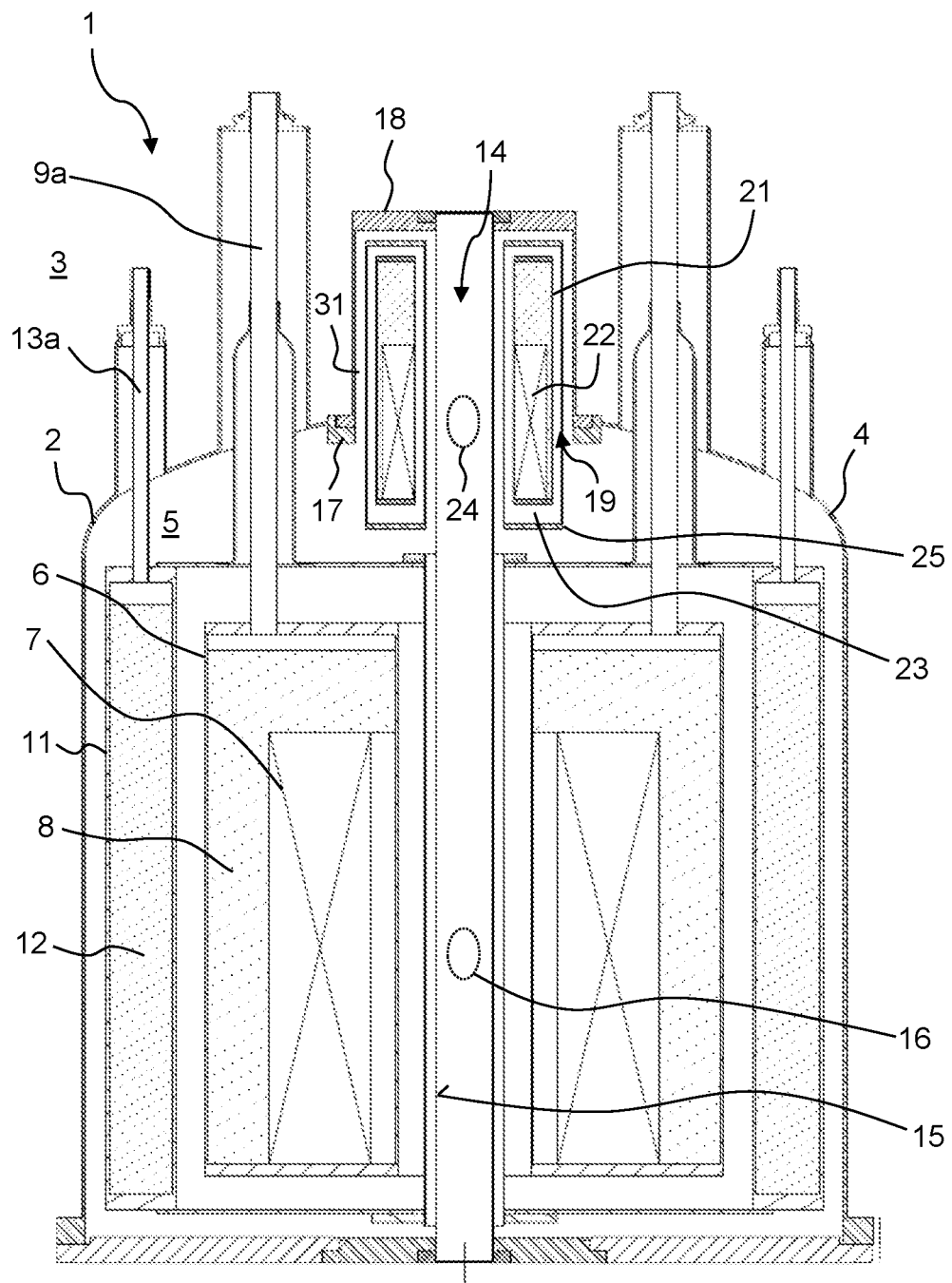
FIG. 4 shows a schematic longitudinal section through a fourth embodiment of a magnet system according to the invention, comprising a hood portion and an additional vacuum container which is arranged in the vacuum of the RT covering.

FIG. 4 shows a fourth embodiment of a magnet system 1 according to the invention. The additional coil container 21 is again arranged in an additional vacuum container 25 which has a vacuum 23 for the additional coil container 21.

Here, the hood portion 18, which protrudes outward (here axially upward) with respect to the RT covering 4, engages over the additional vacuum container 25 and the flange opening 19. An evacuated second gap 31 between the hood portion 18 and the additional vacuum container 25 is open toward the RT covering 4 (in FIG. 4 downward, toward the flange opening 19) here such that the same vacuum 5 as inside the RT covering 4 of the cryostat 2 prevails in the second gap 31. In other words, the additional vacuum container 25 is itself arranged in the vacuum 5, the vacuum 5 of the RT covering 4 and the vacuum 23 in which the additional coil container 21 is arranged being separated (sealed from one another) by the wall of the additional vacuum container 25. If desired, the additional vacuum container 25 can also be cooled, for example with liquid nitrogen (not shown in more detail). In a variant which is not shown in more detail, the additional vacuum container 25 can also be replaced by a non-gas-tight, cooled additional intermediate container as a radiation shield.

A rear (upper) end of the additional vacuum container 25 protrudes into the hood portion 18, and a front (lower) end of said container protrudes through the flange opening 19 into the RT covering 4. The same applies to the additional coil container 21 and the additional field magnet 22. The hood portion 18 seals the RT covering 4 (or the vacuum 5 in its interior) between the flange connection 17 and the RT bore 14 from the surroundings 3. The RT bore 14 is delimited here by a continuous (one-piece) wall pipe 15.

In the design of FIG. 4, the best possible thermal insulation of the additional coil container 21 from the main coil container 6 is achieved. A quenching risk for the main field magnet 7 in the event of energy input into the additional coil container 21, for example by sweeping the second magnetic field in the second sample volume 24, is minimized.

FIGS. 5A-5G illustrate a first variant of a method according to the invention for retrofitting a standard NMR magnet system to a magnet system according to the invention; the obtained magnet system according to the invention here corresponds to the embodiment shown in FIG. 1.

Figure 5A:
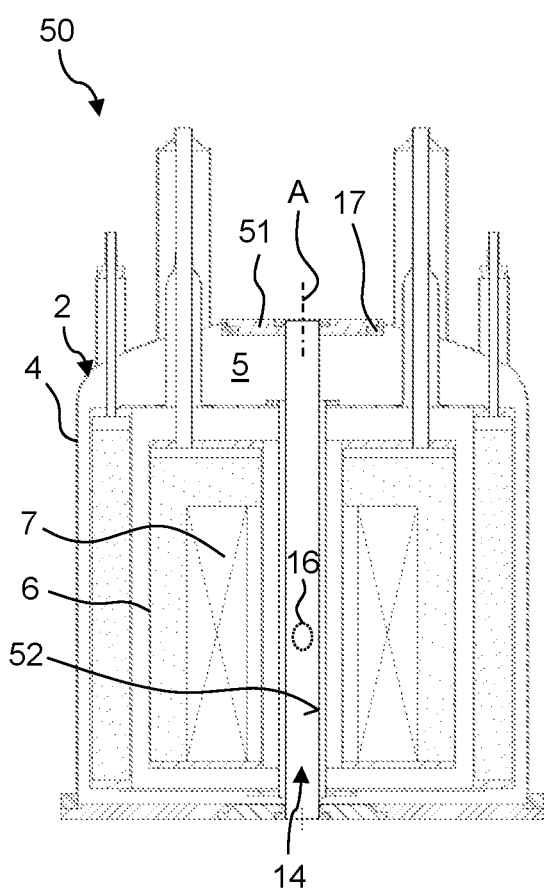
FIGS. 5A-5F schematically show the sequence of a retrofitting method according to the invention in a first variant, including the subfigures FIG. 5A magnet system to be retrofitted.

In a first step a), a conventional magnet system 50 is initially provided which is used for NMR experiments with only one magnetic field or sample volume, as shown in FIG. 5A ("standard NMR system"). The magnet system 50 has a cryostat 2 having a RT covering 4 in which a main field magnet 7 is arranged in a cooled main coil container 6. The cryostat 2 here has a vertical RT bore 14 in which a first magnetic field can be generated on a first sample volume 16 with the main field magnet 7. The RT bore 14 is delimited by an existing, one-piece wall pipe 52. The cryostat 2 is accessible here at its upper axial end (cf. axis A) via a flange connection 17 which is closed by a flange cover 51 in order to be able to maintain a vacuum 5 in the RT covering 4 during conventional operation of the magnet system 50.

Figure 5B:
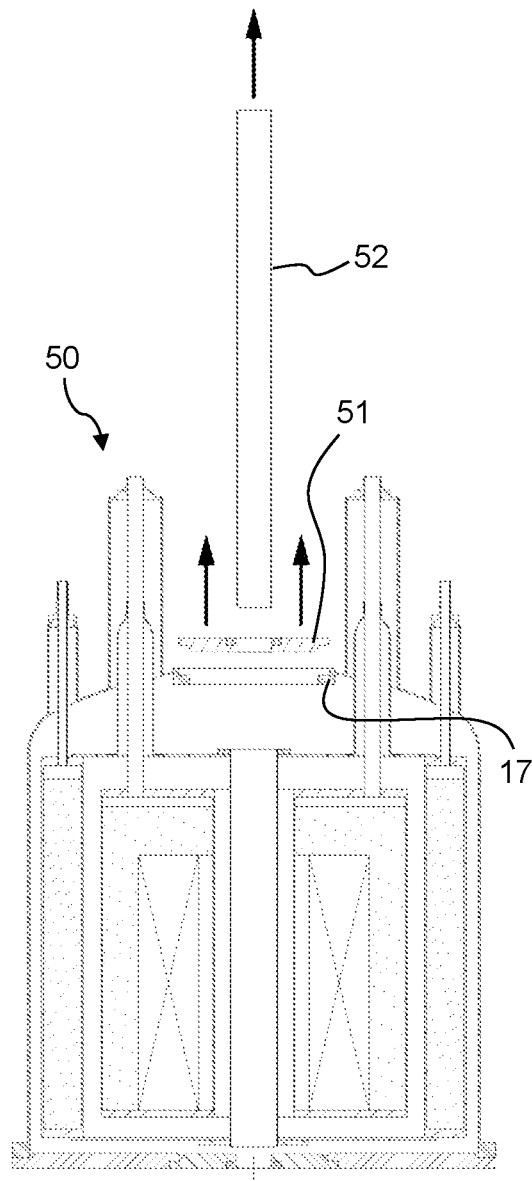

In a next step b), the flange cover 51 is now removed from the flange connection 17; cf. FIG. 5B. If necessary, the interior of the RT covering 4 is ventilated first. In the variant shown, the existing wall pipe 52 is also removed in this step.

Figures 5C, 5D:
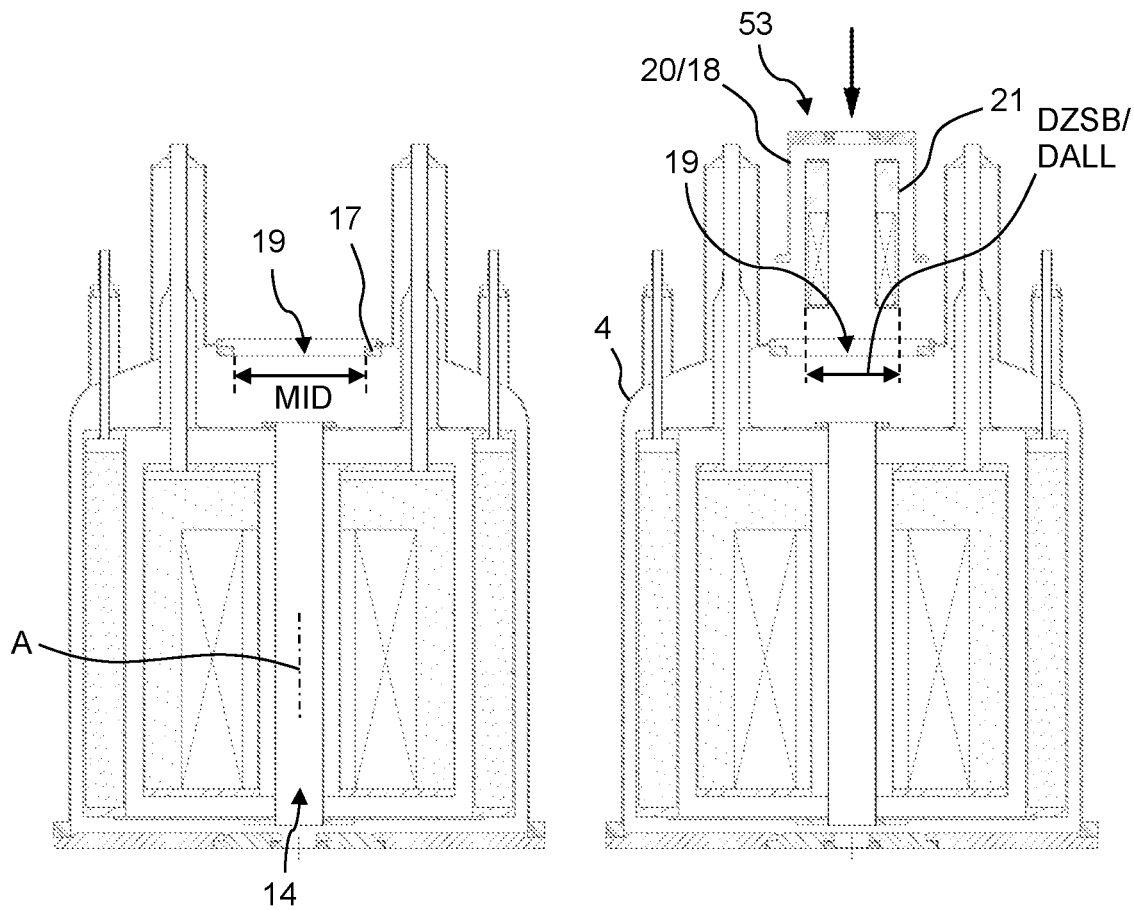

FIG. 5C shows the magnet system 50 opened in this way. The open flange connection 17 has a (round) flange opening 19 having a minimum inner diameter MID. The minimum inner diameter MID is measured transversely to the RT bore 14 or perpendicularly to the axis A (this also applies to all other diameters; see below).

Then, in a step c), the installation of an additional coil container 21 and a closure structure 20, here designed having a hood portion 18, is carried out; cf. FIG. 5D. The additional coil container 21 and the closure structure 20 are rigidly connected to one another (not shown in more detail) and therefore form an assembly 53 which can be installed as a whole. The additional coil container 21 has (at least insofar as it is intended to axially engage in the flange opening 19) a maximum diameter DZSB. Since the assembly 53 here does not comprise any components other than the additional coil container 21 which are provided for engagement in the RT covering 4 and would extend laterally transversely to the axis A further than the additional coil container 21, a maximum outer diameter DALL of all parts to be inserted through the flange opening 19 is equal to DZSB, i.e., DALL=DZSB.

Figures 5E, 5F:
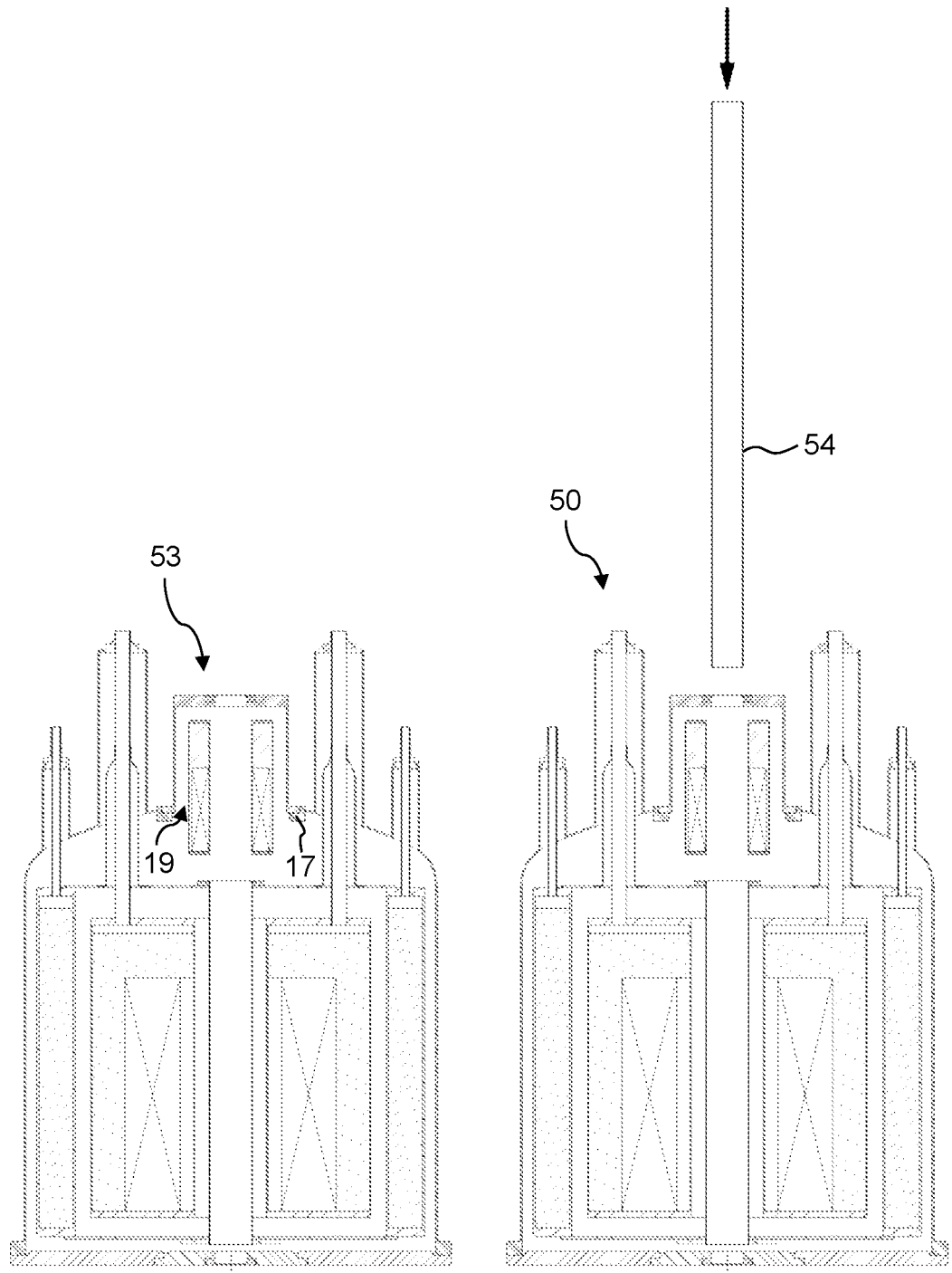

Since DSZB is smaller than MID here, the lower end of the assembly 53 can simply be inserted in the axial direction (here downward) into the flange opening 19 and placed on the flange connection 17 during installation; FIG. 5E shows the installed state of the assembly 53 on the flange connection 17.

A new, one-piece wall pipe 54 is then inserted into the magnet system 50; cf. FIG. 5F. This new wall pipe 54 is longer than the previously removed wall pipe (e.g., 52 in FIG. 5B).

Figure 5G:
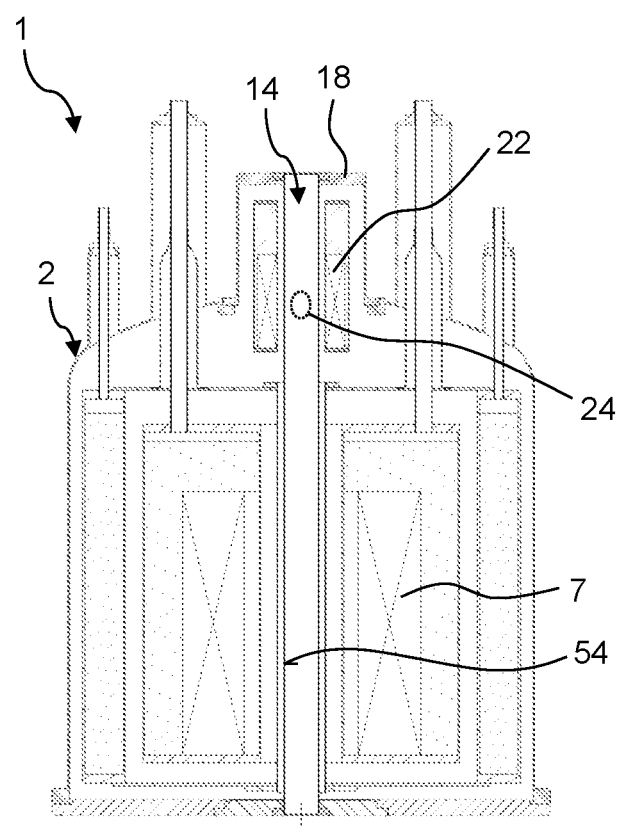
FIG. 5G retrofitted magnet system.

After the new wall pipe 54 has been installed, the retrofitting of the magnet system for 2-field NMR operation is complete; FIG. 5G shows the retrofitted magnet system 1 according to the invention. In particular, a second magnetic field can now be set up on a second sample volume 24 in the RT bore 14 with the additional field magnet 22. The new wall pipe 54 is so long that it forms the RT bore 14 of the magnet system 1 continuously from the region of the main field magnet 7 or the lower end of the cryostat 2 as far as the additional field magnet 22 or the upper end of the hood portion 18.

FIGS. 6A-6G illustrate a second variant of a method according to the invention for retrofitting a standard NMR magnet system to a magnet system according to the invention; the obtained magnet system according to the invention here corresponds to the embodiment shown in FIG. 3. The second method variant from FIGS. 6A-6G is similar to the first variant from FIGS. 5A-5G, and therefore only the fundamental differences are explained in more detail.

Figure 6A:
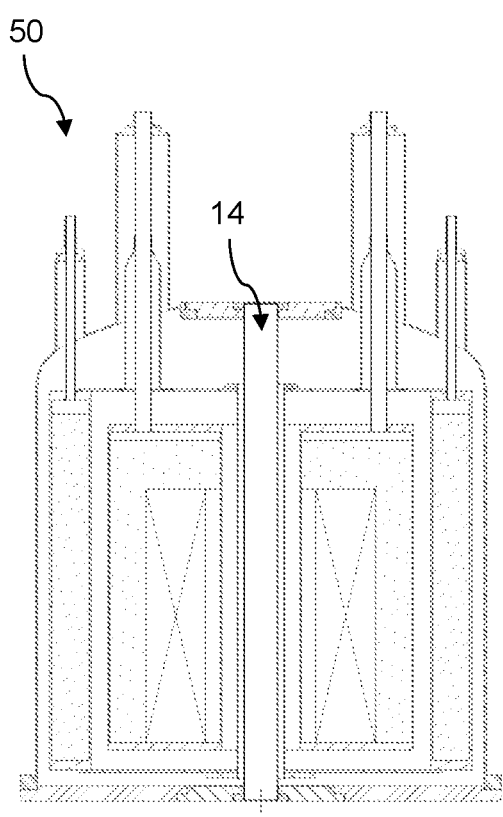
FIGS. 6A-6F schematically show the sequence of a retrofitting method according to the invention in a second variant, including the subfigures FIG. 6A magnet system to be retrofitted.
Figure 6B:
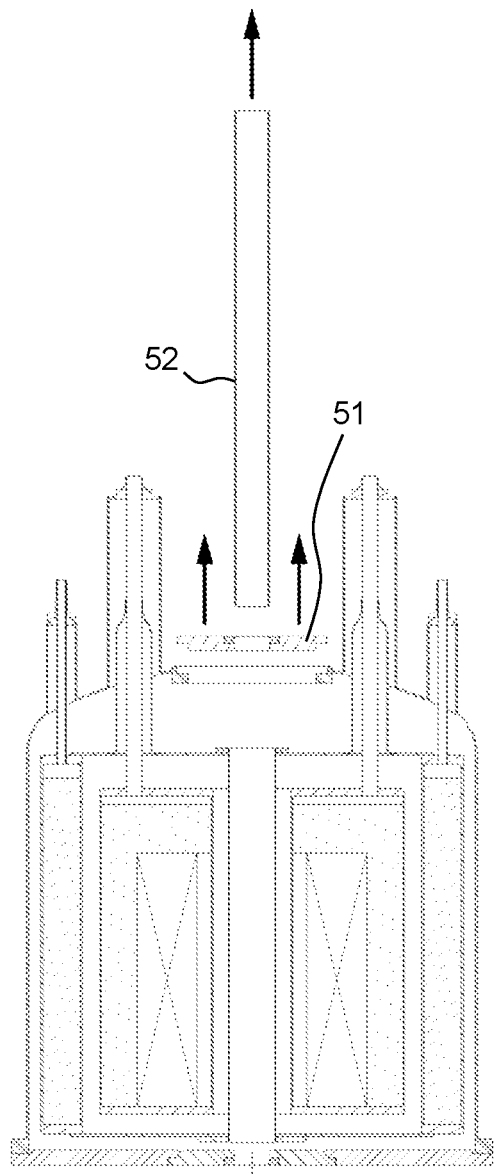
Figure 6C:
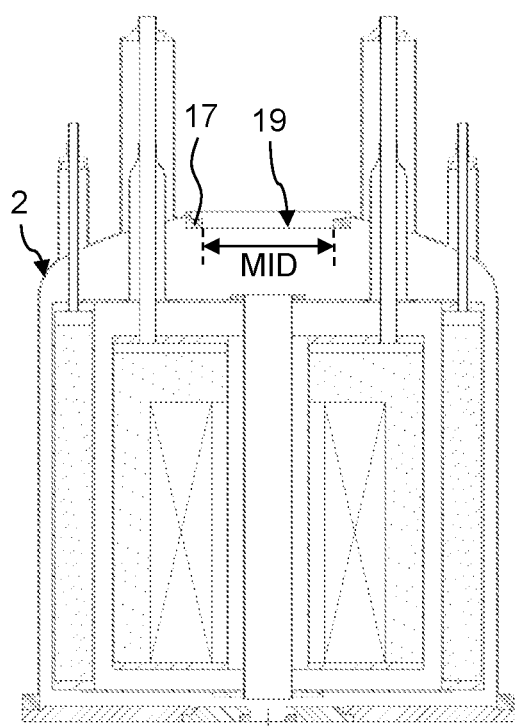

In a first step, as explained in FIG. 5A, a conventional magnet system 50 which is set up for NMR experiments with only one magnetic field or sample volume is provided; cf. FIG. 6A. Then, in a step b), as already explained in FIG. 5B, the flange cover 51 and the existing, one-piece wall pipe 52 of the RT bore are removed; cf. FIG. 6B. As a result, the cryostat 2 is obtained with the flange connection 17 open, as already explained in FIG. 5C and shown in FIG. 6C. The (round) flange opening 19 again has a (maximum) inner diameter MID.

Figure 6D:
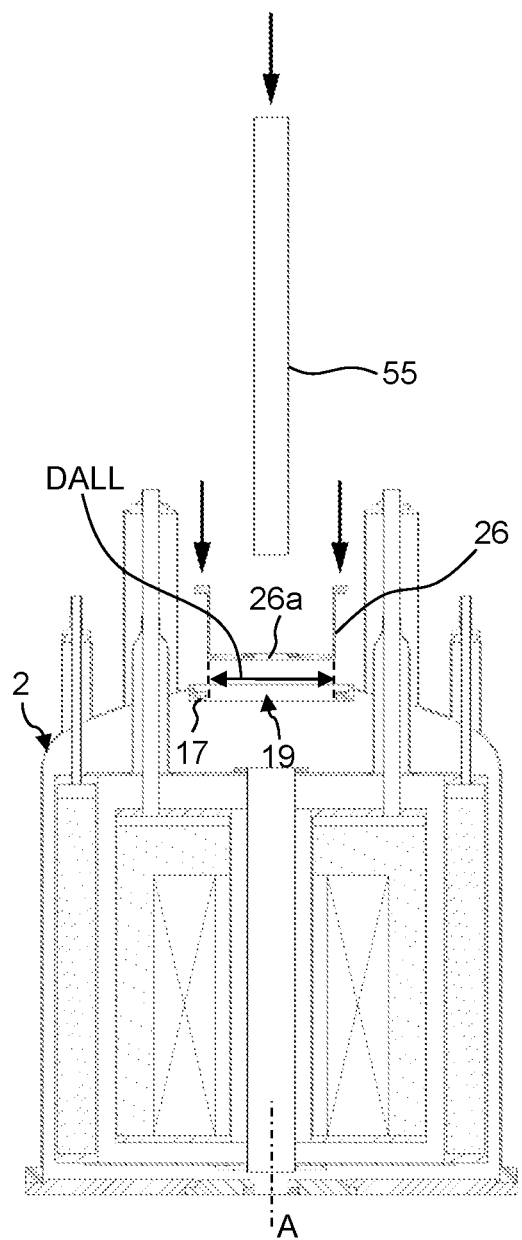

In the context of the following step c), an insert portion 26 is now installed on the flange connection 17 and a new wall pipe 55 is inserted into the cryostat 2 in any sequence; cf. FIG. 6D. This new wall pipe 55 is made shorter than the removed wall pipe (e.g., 52 in FIG. 6B). The new wall pipe 55 can be a replacement part, or it can have been obtained by shortening the removed wall pipe. The cup-shaped insert portion 26 has a through-opening 26a for the RT bore in its bottom. The insert portion 26 is the largest component transversely to the axis A that has to be pushed into the flange opening 19, and therefore defines a maximum outer diameter DALL of all components to be introduced in this way. Since DALL is smaller than MID, the insert portion 26 can simply be pushed axially into the flange opening 19 and placed and installed on the flange connection 17.

Figure 6E:
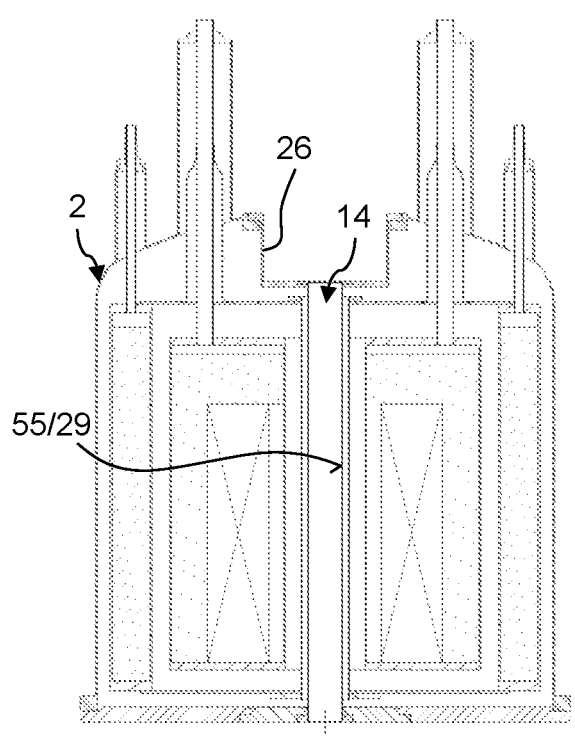

In FIG. 6E, in the installed state, the new wall pipe 55 extends from the lower end of the cryostat 2 as far as the insert portion 26 (in the region of the through-opening, e.g., 26 in FIG. 6D). The wall pipe 55 forms a first section 29 of a wall of an RT bore 14.

Figure 6F:
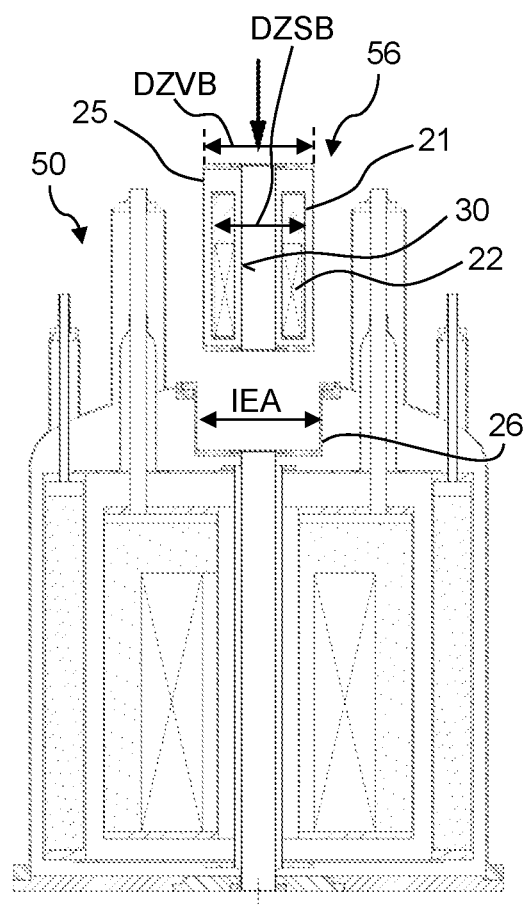

Subsequently, an assembly 56 comprising an additional vacuum container 25 and an additional coil container 21 contained therein is installed together with the additional magnet 22; cf. FIG. 6F. The maximum outer diameter DZVB of the additional vacuum container is smaller than the minimum inner diameter IEA of the receiving region of the insert portion 26 such that the assembly 56 can be pushed axially into the insert portion 26. It should be noted that also DZSB<MID and DZVB<MID. The additional vacuum container 25 and thus also the assembly 56 here also comprises a second section 30 of a wall for the RT bore 14.

Figure 6G:
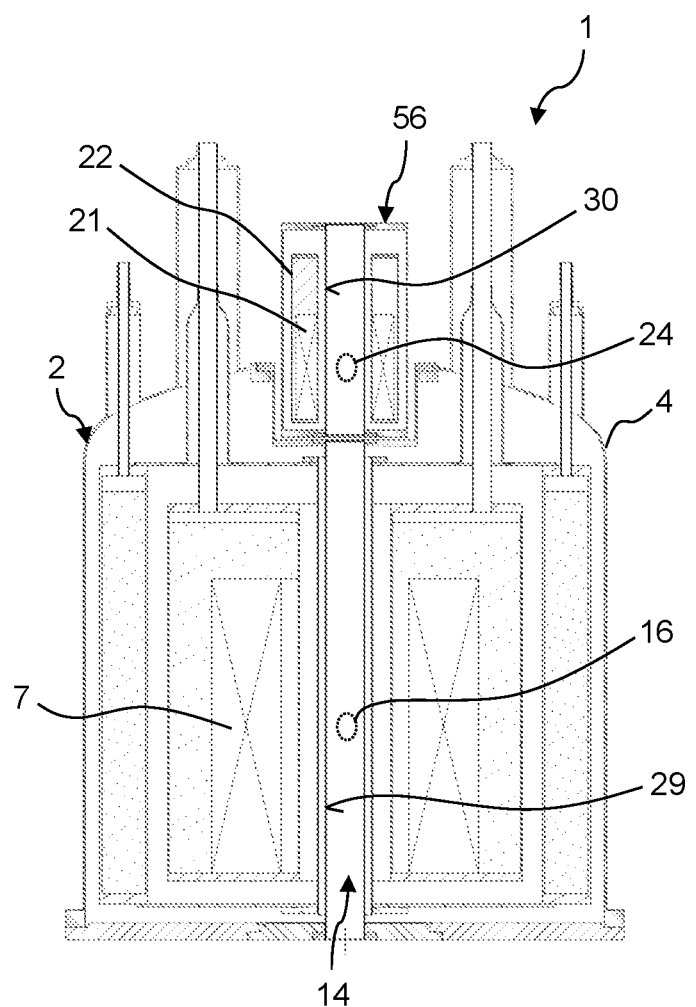
FIG. 6G retrofitted magnet system.

After the assembly 56 has been installed, as shown in FIG. 6G, the retrofitting is finished and the magnet system 1 according to the invention is complete. The sections 29, 30 complement one another to form a complete wall or delimitation of the RT bore 14. In the RT bore 14, a first magnetic field can now be generated in the first sample volume 16 with the main field magnet 7, and a second magnetic field can be generated in the second sample volume 24 with the additional field magnet 22 in order to perform 2-field NMR experiments.

It should be noted that the installation and removal of the assembly 56 or the additional vacuum container 25 can take place without breaking a vacuum 5 inside the RT covering 4 of the cryostat 2.

In summary, the invention, according to one formulation, relates to a magnet system (1) for 2-field NMR experiments, comprising
  a superconducting main field magnet (7) for generating a first magnetic field in a first sample volume (16),
  a superconducting additional field magnet (22) for generating a second magnetic field in a second sample volume (24), and
  a cryostat (2) having a cooled main coil container (6), having an evacuated room temperature (=RT) covering (4), and having a room temperature (=RT) bore (14) which extends through the main field magnet (7) and through the additional field magnet (22), characterized in that the magnet system (1) comprises a cooled additional coil container (21) in a vacuum (23),
in that the RT covering (4) has a flange connection (17) with a flange opening (19) through which the RT bore (14) extends,
in that a front end of the additional coil container (21) protrudes through the flange opening (19) into the RT covering (4) such that the additional field magnet (22) also at least partly protrudes through the flange opening (19) into the RT covering (4),
and in that a closure structure (20) which seals the RT covering (4) between the flange connection (17) and the RT bore (14) is installed on the flange connection (17). This makes 2-field NMR spectroscopy, which can be used flexibly and has good signal strength, possible in a cost-effective manner.

LIST OF REFERENCE SIGNS 1 magnet system
2 cryostat
3 surroundings
4 RT covering
5 vacuum (in RT covering)
6 main coil container
7 main field magnet
8 liquid helium
9a neck pipe (to the main coil container)
9b neck pipe (to the main coil container)
10 intermediate container
11 liquid nitrogen tank
12 liquid nitrogen
13a neck pipe (to the nitrogen tank)
13b neck pipe (to the nitrogen tank)
14 RT bore
15 wall pipe
16 first sample volume
17 flange connection
18 hood portion
19 flange opening
20 closure structure
21 additional coil container
22 additional field magnet
23 vacuum (for the additional coil container)
24 second sample volume
25 additional vacuum container
26 insert portion
26a through-opening
27 container wall
28 first gap
29 first section of the wall of the RT bore (in the cryostat)
30 second section of the wall of the RT bore (in the additional vacuum container)
31 second gap 50 (conventional, retrofittable) magnet system
51 flange cover
52 (existing) wall pipe
53 assembly
54 (longer, new) wall pipe
55 (shorter, new) wall pipe
56 assembly
60 shim system
61 magnetic tunnel
A axis
AB distance between the first and second sample volume
DALL maximum diameter of all protruding components
DZSB maximum diameter of the additional coil container
DZVB maximum diameter of the additional vacuum container
IEA minimum inner diameter of the insert portion
MID maximum inner diameter (flange opening)

What is claimed is:

1. Magnet system for performing 2-field NMR experiments, comprising:
a superconducting main field magnet suited to generate a first magnetic field in a first sample volume,
a superconducting additional field magnet suited to generate a second magnetic field in a second sample volume, the first magnetic field being stronger than the second magnetic field,
a cryostat having a cooled main coil container which contains the main field magnet, having an evacuated room temperature (RT) covering which contains the main coil container, and having a room temperature (RT) bore which extends through the main field magnet and through the additional field magnet and contains the first sample volume and the second sample volume, and
a cooled additional coil container which is surrounded by a vacuum, contains the additional field magnet and is spaced apart from the main coil container, wherein:
the RT covering has a flange connection, the RT bore extending through a flange opening of the flange connection,
a front end of the additional coil container protrudes through the flange opening into the RT covering such that the additional field magnet also at least partly protrudes through the flange opening into the RT covering, and
the magnet system further comprises a closure structure which is installed on the flange connection of the RT covering and seals the RT covering between the flange connection and the RT bore.

2. Magnet system according to claim 1, wherein the magnet system forms a closed, evacuated additional vacuum container in which the additional coil container is arranged, and in which the vacuum in which the additional coil container is arranged prevails such that the vacuum within the additional vacuum container is separated from a vacuum in the RT covering.

3. Magnet system according to claim 1, wherein:
the closure structure comprises an insert portion which protrudes into the flange opening and projects inwardly with respect to the RT covering,
a front end of the additional coil container protrudes into the insert portion, and the RT bore extends through the insert portion.

4. Magnet system according to claim 3, wherein:
the magnet system forms a closed, evacuated additional vacuum container in which the additional coil container is arranged, and in which the vacuum in which the additional coil container is arranged prevails such that the vacuum within the additional vacuum container is separated from a vacuum in the RT covering,
the additional vacuum container is arranged on a side of the insert portion facing away from the main coil container,
the additional vacuum container is delimited by a container wall, which is separate from the insert portion, and the RT bore, and
the insert portion seals the vacuum in the RT covering.

5. Magnet system according to claim 4, wherein a wall of the RT bore is formed from multiple sections, a first section of the wall of the RT bore delimiting the RT covering as far as the insert portion, and a second section of the wall of the RT bore delimiting the additional vacuum container.

6. Magnet system according to claim 1, further comprising:
a hood portion which engages over the flange opening and projects outwardly with respect to the RT covering, wherein:
a rear end of the additional coil container protrudes into the hood portion, and the RT bore extends through the hood portion.

7. Magnet system according to claim 6, wherein:
the magnet system forms a closed, evacuated additional vacuum container in which the additional coil container is arranged, and in which the vacuum in which the additional coil container is arranged prevails such that the vacuum within the additional vacuum container is separated from a vacuum in the RT covering,
the closure structure comprises an insert portion which protrudes into the flange opening and projects inwardly with respect to the RT covering,
a front end of the additional coil container protrudes into the insert portion,
the RT bore extends through the insert portion, and
the additional vacuum container is delimited by walls of the hood portion, of the insert portion and of the RT bore, the insert portion sealing the vacuum in the RT covering from the vacuum in the additional vacuum container.

8. Magnet system according to claim 6, wherein:
the closure structure comprises the hood portion,
a first gap between walls of the additional coil container and of the hood portion is open toward the RT covering,
the vacuum in which the additional coil container is arranged and a vacuum in the RT covering are connected to one another, and
the hood portion seals the vacuum in the RT covering.

9. Magnet system according to claim 6, wherein:
the magnet system forms a closed, evacuated additional vacuum container in which the additional coil container is arranged, and in which the vacuum in which the additional coil container is arranged prevails such that the vacuum within the additional vacuum container is separated from a vacuum in the RT covering,
the closure structure comprises the hood portion,
a rear end of the additional vacuum container protrudes into the hood portion,
a second gap between the walls of the hood portion and of the additional vacuum container is configured open toward the RT covering, and
the hood portion seals the vacuum in the RT covering.

10. Magnet system according to claim 1, wherein a wall of the RT bore is formed in one piece.

11. Magnet system according to claim 1, wherein the cryostat comprises a cooled intermediate container which is arranged in the evacuated RT covering, and wherein the main coil container is arranged in the intermediate container.

12. Magnet system according to claim 11, wherein the intermediate container is cooled with liquid nitrogen.

13. Magnet system according to claim 1, wherein the additional coil container has a maximum outer diameter DZSB transverse to the RT bore that is smaller than the minimum inner diameter MID of the flange opening.

14. Magnet system according to claim 13, wherein all components which protrude through the flange opening into the RT covering have a maximum outer diameter DALL transverse to the RT bore that is smaller than the minimum inner diameter MID of the flange opening.

15. Magnet system according to claim 1, further comprising a shim system configured to homogenize the second magnetic field in the second sample volume.

16. Magnet system according to claim 1, wherein the RT bore passes through a magnetic tunnel in a region between the first sample volume and the second sample volume or contains a magnetic tunnel such that during operation of the magnet system, the magnetic field is at least 0.1 T, everywhere along a sample transport path in the RT bore between the first sample volume and the second sample volume.

17. Magnet system according to claim 16, wherein, during the operation of the magnet system, the magnetic field is at least 0.5 T everywhere along the sample transport path in the RT bore between the first sample volume and the second sample volume.

18. Magnet system according to claim 1, wherein the first sample volume and the second sample volume are physically distanced from one another at a distance AB, where $0.6 \leq AB \leq 1.3$ m.

19. Magnet system according to claim 1, wherein the main field magnet and the additional field magnet are electrically separated from one another.

20. Method for retrofitting a magnet system for 2-field NMR experiments, comprising:
   a) providing a magnet system comprising a superconducting main field magnet suited to generate a first magnetic field in a first sample volume, and a cryostat having a coolable main coil container which contains the main field magnet, having an evacuable room temperature (RT) covering which contains the main coil container, and having a room temperature (RT) bore which extends through the main field magnet and contains the first sample volume, the RT covering having a flange connection, a flange opening of which is closed by a flange cover, the RT bore extending through the flange opening and the flange cover;
   b) removing the flange cover from the flange connection; and
   c) installing an additional coil container which is coolable in the installed state, is surroundable by a vacuum, and contains a superconducting additional field magnet, and installing a closure structure which seals the RT covering between the flange connection and the RT bore on the flange connection of the RT covering, a front end of the additional coil container protruding through the flange opening into the RT covering such that the additional field magnet at least partly protrudes through the flange opening into the RT covering, the additional field magnet being suited to generate a second magnetic field in a second sample volume, the first magnetic field being stronger than the second magnetic field, and the RT bore also extending through the additional field magnet and containing the second sample volume.

21. Method according to claim 20, wherein during said step c) the additional coil container is rigidly connected to the closure structure.

22. Method according to claim 21, wherein, during said step c) all components which protrude through the flange opening into the RT covering are rigidly connected to the closure structure.

23. Method according to claim 20, wherein the room temperature bore of the magnet system provided in said step a) comprises an existing one-piece wall pipe, said method further comprising, after said step a), replacing the existing one-piece wall pipe of the RT bore of the cryostat with a one-piece wall pipe that is axially longer than the existing one-piece wall pipe.

24. Method according to claim 20, wherein the room temperature bore of the magnet system provided in said step a) comprises an existing one piece wall pipe, said method further comprising, after said step a), shortening the existing one piece wall pipe or replacing the existing, one-piece wall pipe of the RT bore of the cryostat with a wall pipe that is axially shorter than the existing one-piece wall pipe, such that a first section of a wall of the RT bore is arranged in the cryostat, which first section protrudes through at least the main coil container, and a second section of the wall of the RT bore is also installed, which second section protrudes through at least the additional coil container.

25. Method according to claim 24, wherein the second section is installed together with the additional coil container during said step c).

* * * * *